United States Patent [19]

Kling

[11] 4,171,528
[45] Oct. 16, 1979

[54] SOLDERABLE ZENER DIODE

[75] Inventor: Harry C. Kling, Boxford, Mass.

[73] Assignee: International Telephone and Telegraph Corporation, Nutley, N.J.

[21] Appl. No.: 957,494

[22] Filed: Nov. 3, 1978

Related U.S. Application Data

[63] Continuation of Ser. No. 806,133, Jun. 13, 1977, abandoned.

[51] Int. Cl.² ............................................. H01L 29/90
[52] U.S. Cl. ..................................... 357/13; 357/67; 357/68; 357/71
[58] Field of Search ........................ 357/13, 67, 68, 71

[56] References Cited

U.S. PATENT DOCUMENTS 3,534,231  10/1970  Biard ..................................... 357/13
4,030,117  6/1977  Kling ..................................... 357/13

Primary Examiner—Edward J. Wojciechowicz

Attorney, Agent, or Firm—John T. O'Halloran; Peter C. Van Der Sluys; Stephen B. Goldman

[57] ABSTRACT

A solderable zener diode adapted for mounting in a package of the type wherein leads or electrodes must be soldered to the diode contact pads has a shallow junction region formed by a controlled diffusion of a first type of semiconductivity impurity into a semiconductive material having a second type of semiconductivity to establish a desired zener voltage. A region of deep diffusion of first type of semiconductivity impurity is formed about and in contact with the shallow junction region, and a metal contact is electrically connected to the deep diffused region about its entire periphery. The shallow junction region is overlayed with a layer of glass and sputtered quartz and a metal contact pad is formed over the entire diffused region of the zener diode including the shallow junction region and the deep diffused region using multiple layers of contact metal.

12 Claims, 10 Drawing Figures

SOLDERABLE ZENER DIODE

This is a continuation, of application Ser. No. 806,133, filed 13 June 1977 now abandoned.

BACKGROUND OF THE INVENTION

1. Field of the Invention

The present invention relates to zener diodes and, more particularly, to zener diodes adapted for mounting in packages that require soldered connections to the diode device.

2. Description of the Prior Art

In applicant's copending application, Ser. No. 557,206 filed Mar. 10, 1975 entitled Zener Diode and issued as U.S. Pat. No. 4,030,117 on June 14, 1977 a zener diode is disclosed that is uniquely applicable for use in a double plug package that is inexpensive and may be machine assembled. The zener diode disclosed in the copending application had many advantages and overcame many difficulties, such as an unacceptable reject rate resulting from shorted junctions caused by alloying of contact metal into the semiconductive material during the high temperature sealing operation required for double plug packages. The disclosed zener diode also overcame poor yields and unpredictable diode characteristics that resulted from the pressure exerted on the silicon material during packaging of the zener diode in the double plug package.

In the copending application, it was taught that by positioning the contact over the deep diffused region, the premature breakdown caused by surface imperfections was eliminated since avalanching did not as readily occur in the deep junction region where the breakdown voltage was substantially higher than in the shallow junction region. It was also determined that by contacting the deep diffused region over its entire length, the current was more advantageously distributed to prevent high current density and the tendency toward avalanche at high current density points. The force exerted on the contact during double plug packaging was not as detrimental to the diode device when the contact was made to the deep diffused region as opposed to the shallow junction region and the force was spread out over a larger contact area thereby reducing the pressure on the contact.

While the zener diode taught in the copending application had many advantages over the prior art, it could not be readily used with other types of packages where leads had to be soldered directly to the diode contacts. Difficulty was experienced in attempting to solder to the silver contact ring and in many instances, the ring cracked causing the solder to flow into the junction region resulting in an unacceptable device. Difficulty was also experienced when attempting to provide a larger area contact since the contact metal would not adhere well to the oxide layer and a hermetic seal could not be provided necessitating the use of an expensive hermetically sealed package.

Thus, the advantages of the zener diode taught in the copending application could not be realized in other types of packages requiring solderable connections.

SUMMARY OF THE INVENTION

The present invention contemplates a zener diode that is particularly adaptable for use in a package that requires soldered contacts. The problems experienced in the prior art devices are eliminated by providing a large area multiple layer metal contact disposed over both the shallow junction region and the deep diffused region to provide good adhesion and a large contact surface for soldering. The first layer of contact metal is sintered to the isolating oxide over the shallow junction region for good adhesion and the metal alloys with the oxide to provide a hermetic seal for the diode junction so that the diode may be inexpensively packaged in plastic. The large contact area provides strength, good adhesion to the oxide and also reduces the pressure exerted on the junction during the soldering operation. The first metal layer of the contact protects the junction during the subsequent soldering operations to prevent solder from entering the junction region. The solder is a soft material having resilient characteristics to compensate for thermal mismatch between the material of the package terminals and the silicon of the zener diode.

Thus, the present invention provides a zener diode having a shallow junction region which may be used in a package requiring solderable contacts.

The primary objective of the present invention is to provide a zener diode that may be mounted in a package requiring solderable contacts.

Another objective of the present invention is to provide a zener diode that may be manufactured with a higher yield than those of the prior art.

Another objective of the present invention is to provide a zener diode that is hermetically sealed and may be encapsulated in a plastic package.

The above mentioned and other features and objectives of the present invention will become more apparent by reference to the following description taken in conjunction with the accompanying drawings.

DESCRIPTION OF THE PREFERRED EMBODIMENT

Figure 1:
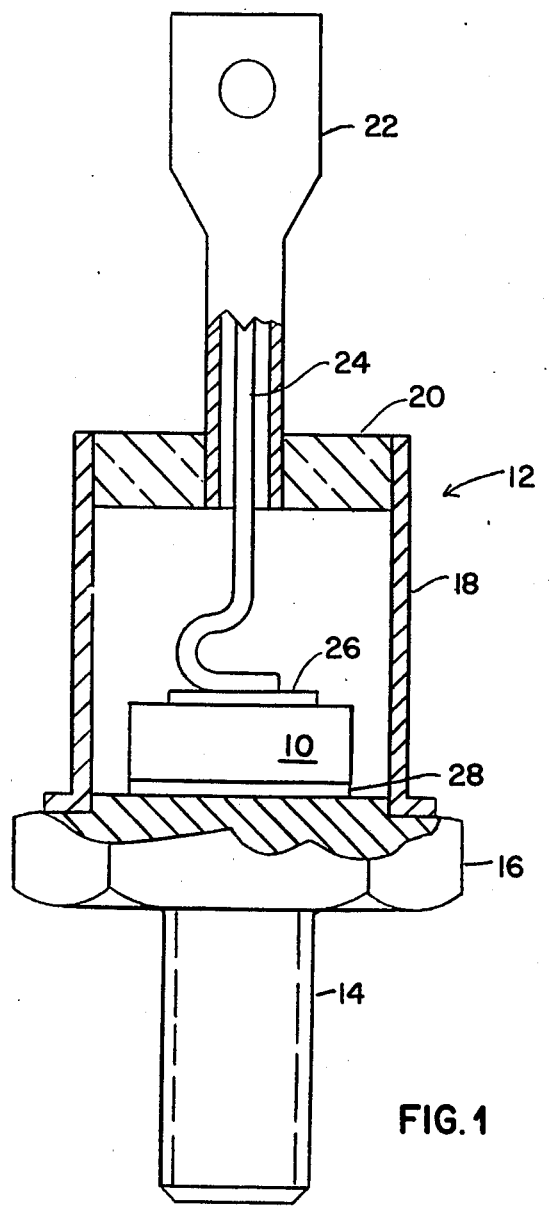
FIGS. 1 and 2 are vertical sections showing examples of packages in which the zener diode of the present invention may be mounted.

Referring to FIG. 1, there is shown a zener diode 10 mounted in a typical stud type package 12. The package includes a threaded stud 14 terminating in a hex shaped head 16, the stud and head 16 form one terminal of the package. A hollow cylindrical body 18 extends upwardly from the head 16 and is enclosed at its uppermost end with an insulating disc 20, in the center of which is mounted a hollow contact terminal 22. A contact lead 24 extends downwardly through the hollow portion of the terminal 22 for making contact to the zener diode which has a first contact 26 soldered to lead 24 and a second contact 28 soldered to the head 16 of stud 14.

Figure 2:
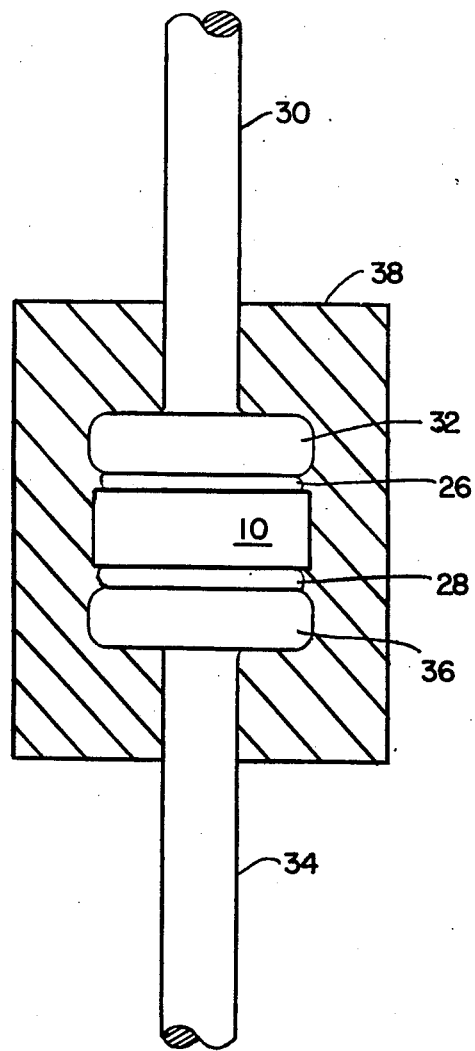

Referring to FIG. 2, there is shown a plastic encapsulated package for the zener diode wherein a metal lead 30 terminates in a nailhead configuration 32 which is soldered to contact surface 26 of the zener diode 10 and a metal lead 34 terminates in a nailhead 36 which is soldered to the contact surface 28 of the zener diode. The entire device is then encapsulated in a plastic package 38.

Referring to FIGS. 3 and 4, there is shown zener diode 10 at various stages during manufacture. In FIG. 3a, there is shown a body of semiconductive material 40 such as silicon which may be of either N or P-type of semiconductivity. For the purposes of this description, it will be assumed that the material 40 is of N-type semiconductivity having a resistivity in the range of 0.005-0.015 ohm-cm and a thickness of approximately 0.012 inches to 0.016 inches. The material may be doped with antimony to provide the N-type semiconductivity. The preferred resistivity of the material 40 depends upon the desired zener voltage, with the lower resistivity material being used for the lower zener voltage devices and the higher resistivity being used for the higher zener voltage devices.

An epitaxial layer 42 is formed on the upper surface of material 40 and is grown to a thickness of 0.65 to 0.75 mils and is doped with phosphorus. The desired resistivity for the epitaxial layer varies from approximately 0.020 to 0.160 ohm-cm depending upon the desired zener voltage in the range of 5 to 33 volts. An oxide layer 44 is formed over the epi layer 42 using standard thermal oxidation techniques.

Figure 3A:
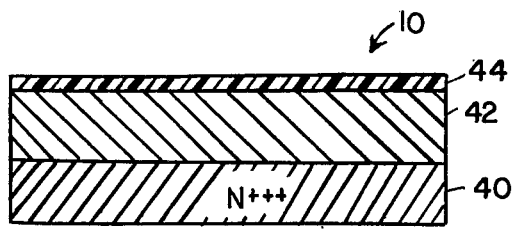
FIGS. 3a through 3f are vertical sections of a zener diode showing the diode at various stages during its manufacture.
Figure 3B:
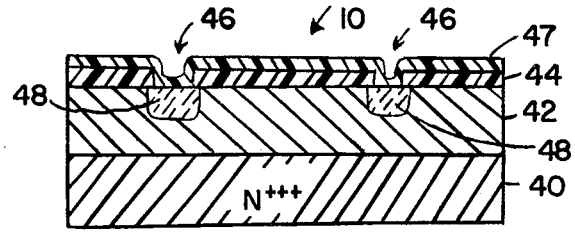
Figure 4A:
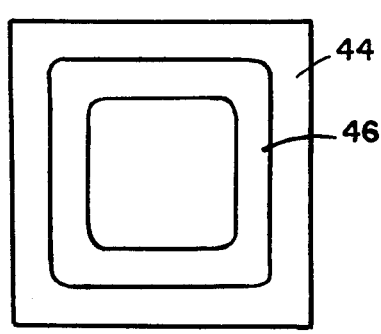
FIGS. 4a and 4b are plan views of a diode showing the diode at different stages during its manufacture.

In FIG. 3b, a selected portion 46 of the oxide layer 44 is removed using standard photoresist and etching techniques to expose a portion of epi layer 42. FIG. 4a shows a plan view of the device wherein the portion 46 is formed as a continuous doughnut shape and has a width of approximately 70 microns. The exposed material of the epi layer 42 is then subjected to a boron deposition step for a period of about 15 to 20 minutes at an impurity concentration of $10^{18}$–$10^{21}+$ atoms per ccm. The wafer is then deglazed to remove the resulting borosilicate glass from the exposed epi surface. The boron is then diffused into the epi layer to a depth of 3 to 12 um by subjecting the device to an elevated temperature of about 1260° C. for 20 to 30 minutes. This diffusion forms a deep diffused guard ring 48 having P-type semiconductivity in the epitaxial layer 42. The guard ring 48 has a resistivity of approximately 3 ohm-cm.

A silicon nitride $Si_3N_4$ layer 47 may then be formed over the entire surface of the device. If it is preferable, the boron diffusion step could be performed prior to the formation of the silicon nitride layer.

The encircled portion of the oxide layer 44 and the silicon nitride layer is then removed to expose the portion of the epitaxial layer 42 encircled by the guard ring 48.

Figure 3C:
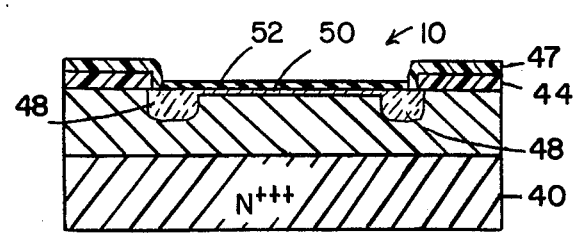

The epi layer 42 is then subjected to a second boron deposition step at an impurity concentration of $10^{18}$ to $10^{21}+$ atoms per ccm for a period of approximately 15 to 20 minutes to form a shallow junction region 50. The time for diffusion depends to a great extent upon the desired zener voltage which is controlled by the depth of the shallow junction region being formed. During the boron diffusion step, a layer of borosilicate glass 52 is formed over the surfaces of the P-type semiconductivity material as shown in FIG. 3c.

Figure 3D:
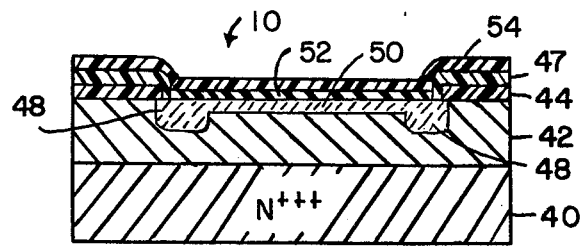

In order to protect the junction region, the entire surface of the device is coated with an oxide layer 54 as shown in FIG. 3d. The oxide layer should be deposited rather than thermally grown so as not to disturb the junction region. Preferably, the oxide layer is formed by RF sputtering quartz to a thickness of approximately 1,000 to 12,000 A as shown in FIG. 3d. After RF sputtering the quartz, the quartz is densified and the boron contained in region 50 is driven to the proper depth for the desired zener voltage by subjecting the device to an elevated temperature of about 1260° C. for a time duration of up to 2½ hours depending upon the desired zener voltage and the resistivity of the epitaxial layer.

Figure 4B:
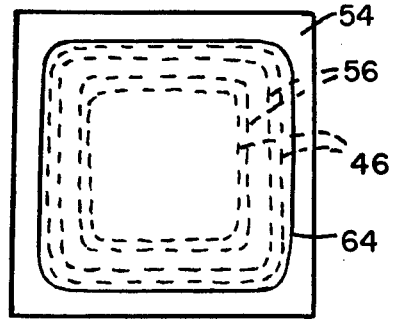
Figure 3E:
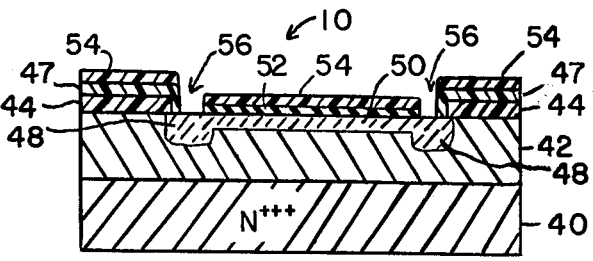

After formation of the layer 54, a region 56 of the oxide layer 54 and the borosilicate glass 52 is removed as shown in FIGS. 3e and 4b using standard photoresist and etching techniques. Region 56 has a configuration similar to portion 46 and is positioned over and centered within portion 46. Region 56 has a width of approximately 37.5 microns so that the opening in the oxide is positioned over and centered on the guard ring 48.

Figure 3F:
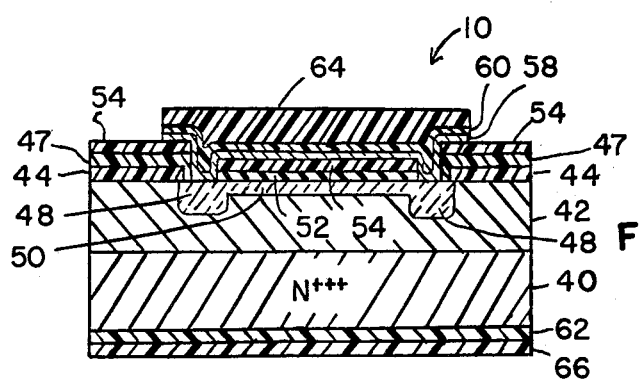

A first layer of metal is then deposited over the entire surface of the device 10, said metal being selected from a group including chrome, titanium or aluminum. Preferably chrome, aluminum is only used over P-type semiconductive material. The excess metal extending outwardly beyond the perimeter of the guard ring 48 may be removed using a photoresist and etching process to provide a layer 58 as shown in FIG. 3f. The metal of the first layer 58 is then sintered at the alloying temperature of the metal which causes the metal to alloy into the oxide layer 54 and form a hermetic seal over the exposed edges of the junction. A second metal layer 60 of nickel or copper is then plated over the chrome as shown in FIG. 3f. Simultaneously or separately, the opposite side of the semiconductive material 40 is coated with a layer 62 of metal selected from a group including nickel and titanium. Preferably layer 62 is nickel sintered nickel.

At this point in the processing the devices may be soldered in the desired package or layers 60 and 62 may be coated with gold to prevent oxidation of the metal in the event that the devices are not going to be presoldered or packaged immediately.

If the devices are to be presoldered, then a solder or tin layer 64 is formed over layer 60 and a solder or tin layer 66 is formed over layer 62. Layers 64 and 66 may be formed by dipping in molten solder or by applying solder in paste form with a doctor blade and thereafter firing the solder or by evaporation techniques. Layers 64 and 66 are preferably of a thickness of about 1 to 2 mils. The presoldered devices may then be stored as is or assembled into packages as illustrated in FIGS. 1 and 2 as examples.

It is to be understood that while the above description used a P-type diffusion into an N-type epitaxial layer, the invention clearly covers the use of an N-type diffusion into a P-type material so that both NP or PN junctions may be formed using the present invention.

Thus, the present invention provides a zener diode with all the advantages of the diode taught in the co-pending application but in addition provides greater versatility by being solderable and hermetically sealed. The metal of the first layer 58 alloys with the oxide layer 54 to provide a hermetic seal for the junction between the P-type semiconductivity material and the N-type semiconductivity material so that the device need not be provided with an expensive hermetically sealed package. The first metal also protects the junction from molten solder during the subsequent soldering operation. The first metal, due to the alloying, adheres well to the oxide layer and does not peel off during soldering. The second metal layer 60 provides a good contact surface for the solder or tin.

The large area of the metal contact provides strength, reduces the pressure on the junction region and facilitates the soldering operation. The soft solder or tin layer compensates for mismatches between the thermal coefficients of expansion of the package terminals and the silicon.

Thus, the present invention provides a zener diode that is readily adaptable for use in a solderable package by providing large area low pressure contact surfaces and a contact material that, in addition to providing a hermetic seal, also prevents contamination of the junction during a subsequent soldering operation.

What is claimed is:

1. A solderable zener diode, comprising:
    a body of semiconductive material having a first type of semiconductivity, said body having opposed front and back surfaces;
    an electrical contact formed on the back surface of said body;
    a shallow region of second type of semiconductivity formed in the front surface of said body opposite said electrical contact and in PN junction forming relation with the first type of semiconductivity of the body;
    a deep diffused region of second type of semiconductivity formed in the front surface of said body in contact with and about the entire periphery of the shallow region;
    a dielectric layer formed on the entire surface of the shallow region and an adjacent portion of the deep diffused region about the shallow region; and
    an electrical contact alloyed into said dielectric layer over the shallow region and the deep diffused region thereby providing a hermetic seal, said contact being connected to the deep diffused region over the entire length thereof and about the entire periphery of the shallow region.

2. The zener diode as described in claim 1, additionally comprising a dielectric layer formed over a portion of the front surface of the body surrounding the deep diffused region and over an adjacent portion of said deep diffused region.

3. The zener diode as described in claim 1, wherein said contact formed over the diffused regions of the body comprises at least two metal layers, the first of which is alloyed to the dielectric layer and the second of which provides good surface characteristics for solder adhesion.

4. The zener diode as described in claim 3, wherein the first metal layer of the contact is formed of a metal selected from a group of metals including chrome, titanium and aluminum, and the second metal layer is formed from a metal selected from a group of metals including nickel and copper.

5. The zener diode as described in claim 3, wherein the metal of the first layer provides good adhesion.

6. The zener diode as described in claim 2, wherein the dielectric layer over the shallow region and the dielectric layer surrounding the deep diffused region each include deposited oxide.

7. The zener diode as described in claim 1, wherein the dielectric layer over the shallow region includes a first layer of silicate glass inherently formed during formation of the shallow region and a layer of deposited oxide over said silicate glass.

8. The zener diode as described in claim 2, wherein the dielectric layer surrounding the deep diffused region includes a silicon nitride layer overlaid with a layer of deposited oxide.

9. The zener diode as described in claim 1, wherein the contact formed on the back surface is formed of a metal selected from a group including nickel and titanium.

10. The zener diode as described in claim 1, in which the contact formed on the back surface comprises nickel sintered nickel.

11. A zener diode as described in claim 1, additionally comprising layers of metal formed on the contacts of the front and back surfaces, said metal being selected from a group including tin and solder.

12. The zener diode as described in claim 11, additionally comprising means for encapsulating said zener diode, said means including electrical contact means soldered to the front and back contacts of the zener diode.

* * * * *